(12) United States Patent
Graham et al.

(10) Patent No.: US 11,329,622 B2
(45) Date of Patent: May 10, 2022

(54) AUTOMATIC CALIBRATION OF AN AMBIENT NOISE COMPENSATION SYSTEM

(71) Applicant: MITEK CORP., INC., Phoenix, AZ (US)

(72) Inventors: Brandon Graham, Sandy, UT (US); Johnathan Ivey, Chandler, AZ (US)

( * ) Notice: Subject to any disclaimer, the term of this patent is extended or adjusted under 35 U.S.C. 154(b) by 117 days.

(21) Appl. No.: 16/854,541

(22) Filed: Apr. 21, 2020

(65) Prior Publication Data

US 2020/0389143 A1 Dec. 10, 2020

Related U.S. Application Data

(60) Provisional application No. 62/858,294, filed on Jun. 6, 2019.

(51) Int. Cl.
*H03G 3/20* (2006.01)
*H03G 3/00* (2006.01)
*H03G 3/32* (2006.01)
*H03G 3/04* (2006.01)

(52) U.S. Cl.
CPC ............... *H03G 3/32* (2013.01); *H03G 3/002* (2013.01); *H03G 3/04* (2013.01)

(58) Field of Classification Search
CPC ............. H03G 3/32; H03G 3/002; H03G 3/04
USPC .......................................... 381/57, 104–109
See application file for complete search history.

(56) References Cited

U.S. PATENT DOCUMENTS

| | | |
|---|---|---|
| 9,431,982 B1 | 8/2016 | Yang et al. |
| 10,243,528 B2 | 3/2019 | Dow et al. |
| 2005/0059369 A1* | 3/2005 | Sapashe ................... H03G 3/32 |
| | | 455/177.1 |

FOREIGN PATENT DOCUMENTS

EP          2101411 B1     6/2016

\* cited by examiner

*Primary Examiner* — Ammar T Hamid
(74) *Attorney, Agent, or Firm* — Keith L. Jenkins, Registered Patent Attorney, LLC; Keith L. Jenkins

(57) ABSTRACT

An element of an automatic gain control system that automatically calibrates a Composite Gain vs Ambient Noise look-up table responsive to user zone gain inputs at various ambient noise levels. The table is a graph of adjacent (horizontally or diagonally) data points (nodes) mapping ambient noise to composite gain. Three algorithmic rules determine position changes of the nodes responsive to zone gain inputs. A curve may be fit to an arrangement of adjacent nodes. The curve, or the interpolated table value, is used with an ambient noise input to determine the current composite gain. The element may be used with many traditional ANC systems. Once calibrated over the full range of ambient noises in the user's space, the ANC system may never need further user zone gain inputs.

20 Claims, 13 Drawing Sheets

AUTOMATIC CALIBRATION OF AN AMBIENT NOISE COMPENSATION SYSTEM

RELATIONSHIP TO OTHER APPLICATIONS

This application claims the benefit of US provisional patent application No. 62/858,294 filed Jun. 6, 2019 for the same inventor.

FIELD OF ART

The present invention relates to a method for automatic calibration of an Ambient Noise compensation (ANC) system. The present invention more particularly relates to a method of calibrating a lookup table of Composite Gain vs Ambient Noise Levels to derive a calibrated gain curve.

BACKGROUND

In certain commercial spaces, it is necessary to ensure that paging announcements are audible for the customers. A typical example is an airport where passengers need to be able to hear when their flight is boarding. The noise levels in these spaces are not constant. When heavily occupied, an airport terminal becomes much louder, making it hard to hear the paging announcements in that space. Various systems have been devised to address this issue by tracking the ambient noise levels in the acoustic space and adjusting gains accordingly in their announcement systems. Their level of effectiveness varies, but one thing they all have in common is the need for calibration by the sound system integrator. One of the most critical components of this calibration is the setting of thresholds which govern the noise level limits at which the system stops adjusting gains. As noise level increases, there becomes a point where the audio gain should no longer be increased. One reason for this is to protect the digital gain circuits from overdriving the speakers. Another critical reason for this upper threshold is to prevent a sort of feedback loop from occurring where louder audio causes customers to talk louder which increases the noise level, which increases audio gain, etc. This scenario is easy to encounter in a space where music is being played over the announcement system. The lower noise threshold is also important to set. If music is being played in a room, customers don't want the music levels to decrease dramatically during lulls in conversations or when the room is unoccupied. There is some minimum level at which the customers do expect the audio to stay.

Accurately set thresholds are critical for the perceived effectiveness of the noise-compensation system. Unfortunately, the ideal thresholds for a given room are often unknown to the integrator, because he is installing and testing the system when the space is not occupied by the customers. Because of this, he has to take a best guess at where the thresholds should be placed and the range of noise levels customers will experience in that space.

Problem Summary

A major shortcoming of existing Ambient Noise Compensation (ANC) systems is that any inaccuracy in the integrator's estimate can only partially be compensated for by the customer. The end result is a noise-compensation system which still requires the end-user to modify the gains throughout the day which defeats the entire purpose of the system.

To illustrate the problem, FIG. 1 illustrates a Composite Gain 114 vs Ambient Noise level 112 table 102 that shows that while the system integrator has control over the necessary elements of the prior art ANC gain target curve 106 (horizontal offset 110 and scale 116), the end-user only has control to move the entire preset prior art ANC gain target curve 106 vertically to close gap 108 by adjusting the system audio levels (assuming they don't have access to the ANC parameters exposed to the integrator). Meeting the ideal target gain curve 104 with the prior art ANC gain target curve 106 presents difficulties.

FIG. 2 illustrates a potential prior art ANC gain target curve 106 calibrated by the integrator to behave well at the low range 202 of ambient noise levels 112 experienced during setup. In this case, the system integrator assumed the customer wouldn't want the prior art ANC algorithm to react further to any ambient noise levels 112 above 75 dBA (dB SPL, A-weighted) in the high range 204 when in fact the customer needed the algorithm to react to ambient noise levels 112 up to roughly 95 dBA 204, leaving a bad fit (large gap 208) between the prior art ANC gain target curve 106 and the ideal target gain curve 104. A good gap 210 is achieved at the lower range 202 of ambient noise levels 112.

As ambient noise levels 112 increase, the customer is thus required to manually increase the gain of the audio system which moves the entire prior art ANC gain target curve 106 upward as shown in FIG. 3, creating a better fit (small gap 308 vs large gap 208) to the ideal target gain curve 104 at high noise levels 304 but a worse fit (large gap 310 vs small gap 210) in the lower range 302 of the ambient noise levels 112.

As ambient noise levels 112 decrease, the customer will again be required to adjust the gains, this time in a downward direction. In effect the prior art ANC system did not serve its purpose because the customer is still required to adjust the gains to accommodate changes in ambient noise levels 112.

The prior art solution didn't work because the prior art ANC gain target curve 106 was not correctly calibrated to meet the customer's needs, and the customer had no easy way to correctly re-calibrate the system (i.e. change the shape of the prior art ANC gain target curve 106).

SUMMARY OF THE INVENTION

A system is presented which automatically adjusts the noise-compensating gain targets based on end-user adjustments to the audio levels. This offers two improvements over prior art systems. First, it allows calibration of the noise compensation gain target curve by the end-user without any conscious effort on their part. The resulting calibration curve accurately reflects the end-user's preferences for that specific space (they should rarely have to adjust levels after the curve has been established). Second, the integrator no longer needs to attempt to estimate the noise levels and thresholds for the installation environment. This reduces setup time, and the auto-calibrated target gain curve will likely result in increased customer satisfaction as well. The present inventive method is independent of how the rest of the ANC algorithm is implemented, as long as the algorithm delivers ambient noise level estimates and accepts a Target Gain value as an input.

DESCRIPTION OF THE FIGURES OF THE DRAWINGS

The present invention will hereinafter be described in conjunction with the following drawing figures, wherein like numerals denote like elements.

DETAILED DESCRIPTION OF THE INVENTION

Figure 1:
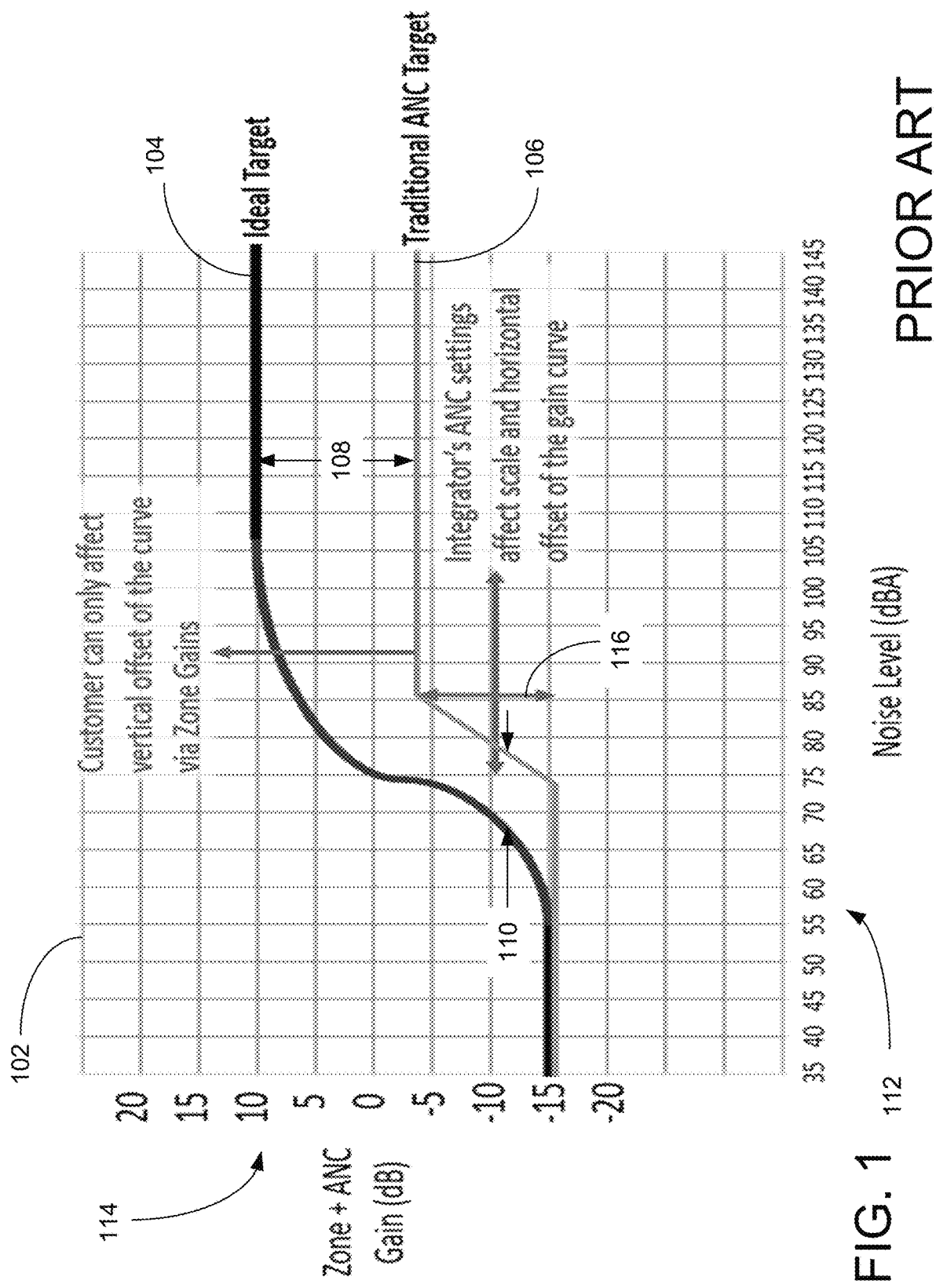
FIG. 1 is a Composite Gain vs Ambient Noise table view illustrating an aspect of the problem to be solved.

As used and defined herein, "dBA" means "A-weighted decibels", "dB" means "decibels", and "dB SPL" means "decibels sound pressure level". The hundreds digit(s) in the reference numerals in the drawings refer to the drawing number in regard to which the referenced item was first discussed.

FIG. 1 is a Composite Gain 114 vs Ambient Noise 112 table 102 view illustrating an aspect of the problem to be solved. A Composite Gain 114 vs Ambient Noise level 112 table 102 shows that while the integrator has control over the necessary elements of the prior art ANC gain target curve 106 (horizontal offset 110 and scale 116), the end-user only has control to move the entire preset prior art ANC gain target curve 106 vertically to change gap 108 by adjusting the audio in their space (assuming they don't have access to the ANC parameters exposed to the integrator).

Figure 2:
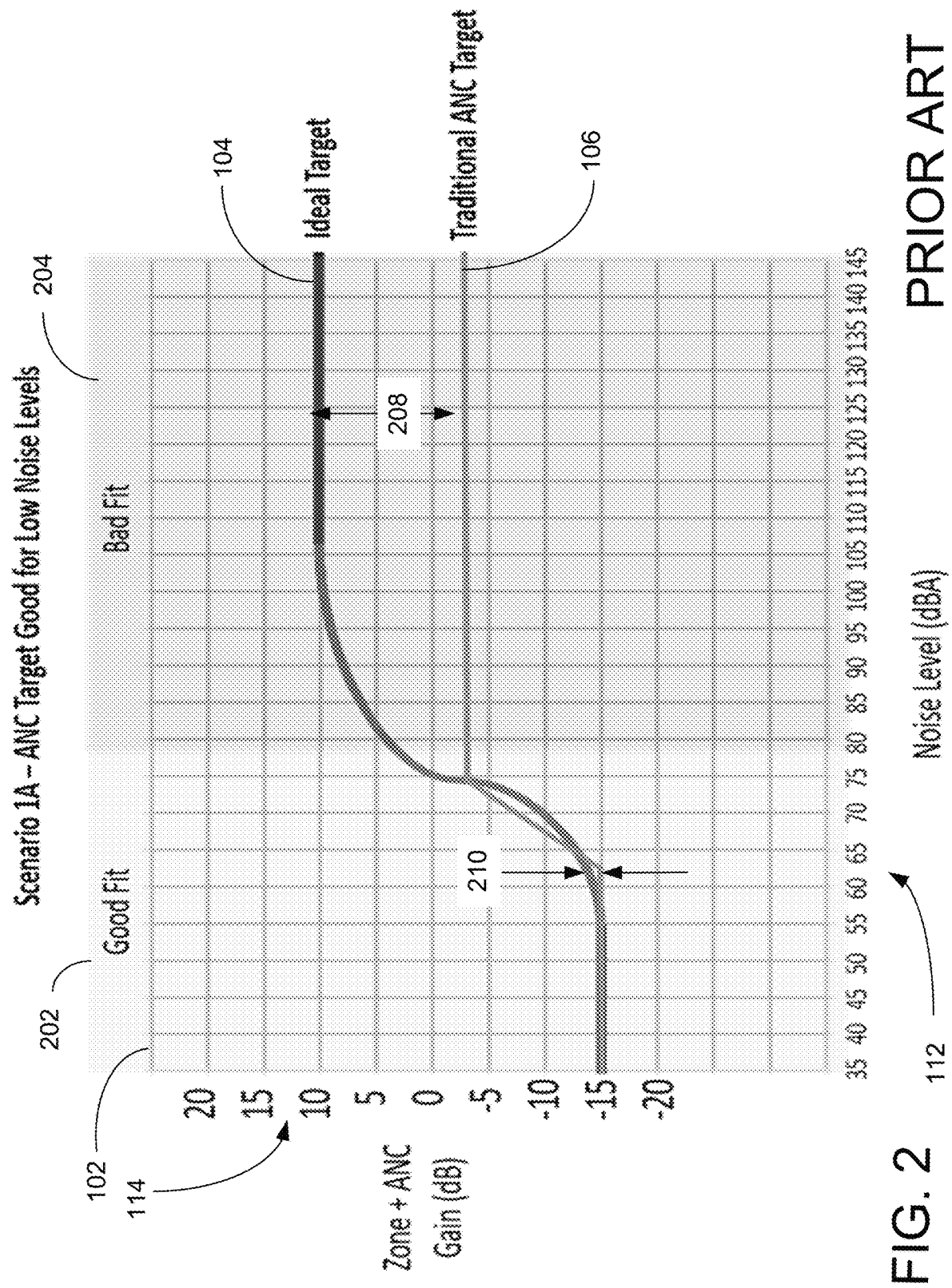
FIG. 2 is a Composite Gain vs Ambient Noise table view illustrating another aspect of the problem to be solved.

FIG. 2 is a Composite Gain 114 vs Ambient Noise 112 table 102 view illustrating another aspect of the problem to be solved. A potential prior art ANC gain target curve 106 calibrated by the integrator to behave well at the low range 202 of ambient noise levels 112 is established during setup. In this case, the integrator assumed the customer wouldn't want the ANC algorithm to react further to any ambient noise levels 112 in the high range 204 (above 75 dBA) when in fact the customer needed the algorithm to react to ambient noise levels 112 into the high range 204 (up to roughly 95 dBA), leaving a bad fit (large gap 208) between the prior art ANC gain target curve 106 and the ideal target gain curve 104. The prior art ANC gain target curve 106 and the ideal target gain curve 104 have a good fit 210 at the low noise levels 202.

Figure 3:
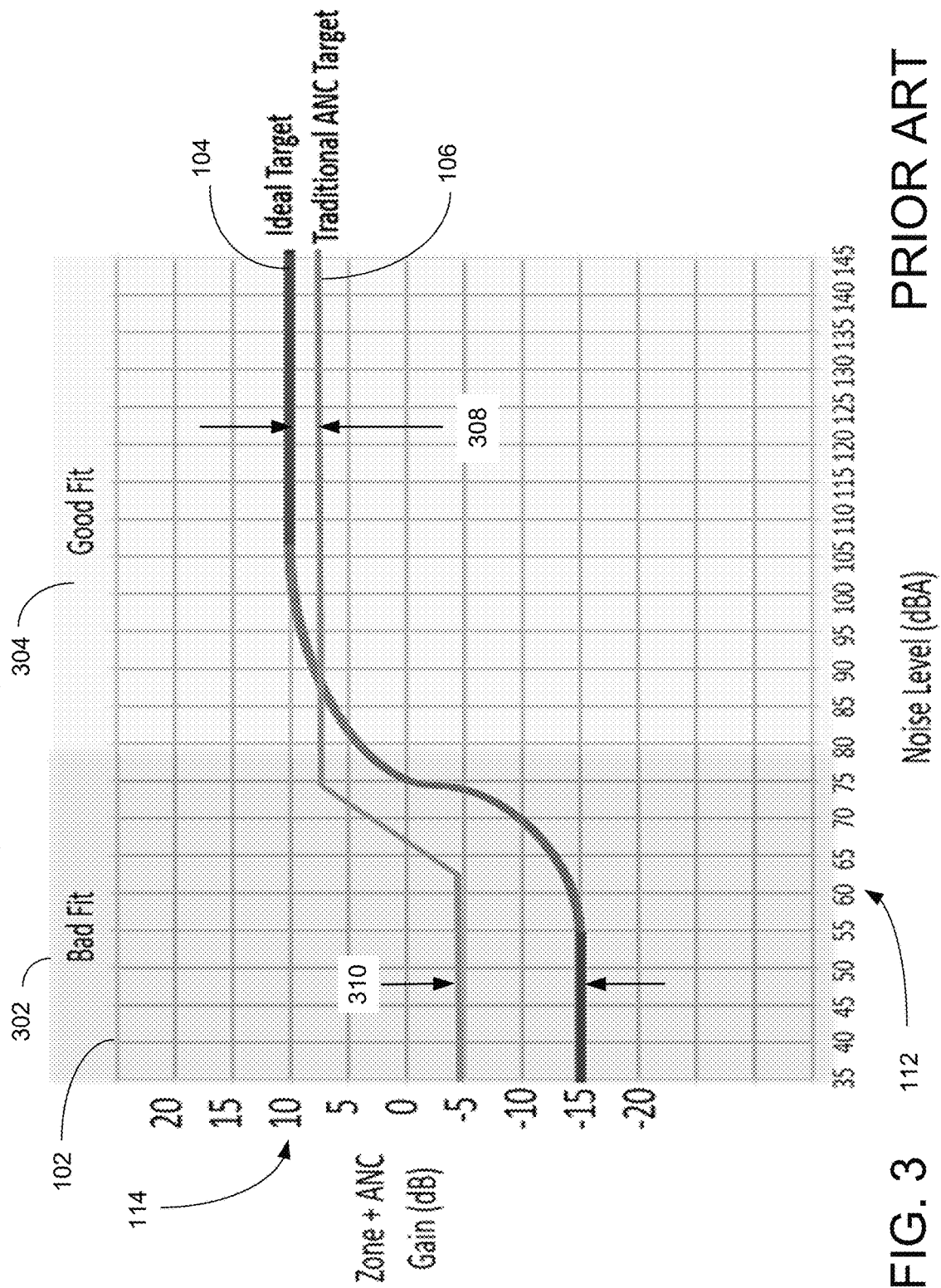
FIG. 3 is a Composite Gain vs Ambient Noise table view illustrating yet another aspect of the problem to be solved.

FIG. 3 is a Composite Gain 114 vs Ambient Noise 112 table 102 view illustrating yet another aspect of the problem to be solved. As ambient noise levels 112 increase, the user of the prior art is required to manually increase the gain of the audio system which moves the entire prior art ANC gain target curve 106 vertically, creating a better fit 308 to the ideal target gain curve 104 at high noise levels 304 but a worse fit (large gap 310) at low noise levels 302. In summary, the user can adjust the problematic ANC system for a good fit for only a portion of the ambient noise levels 112 experienced in their environment.

Figure 4:
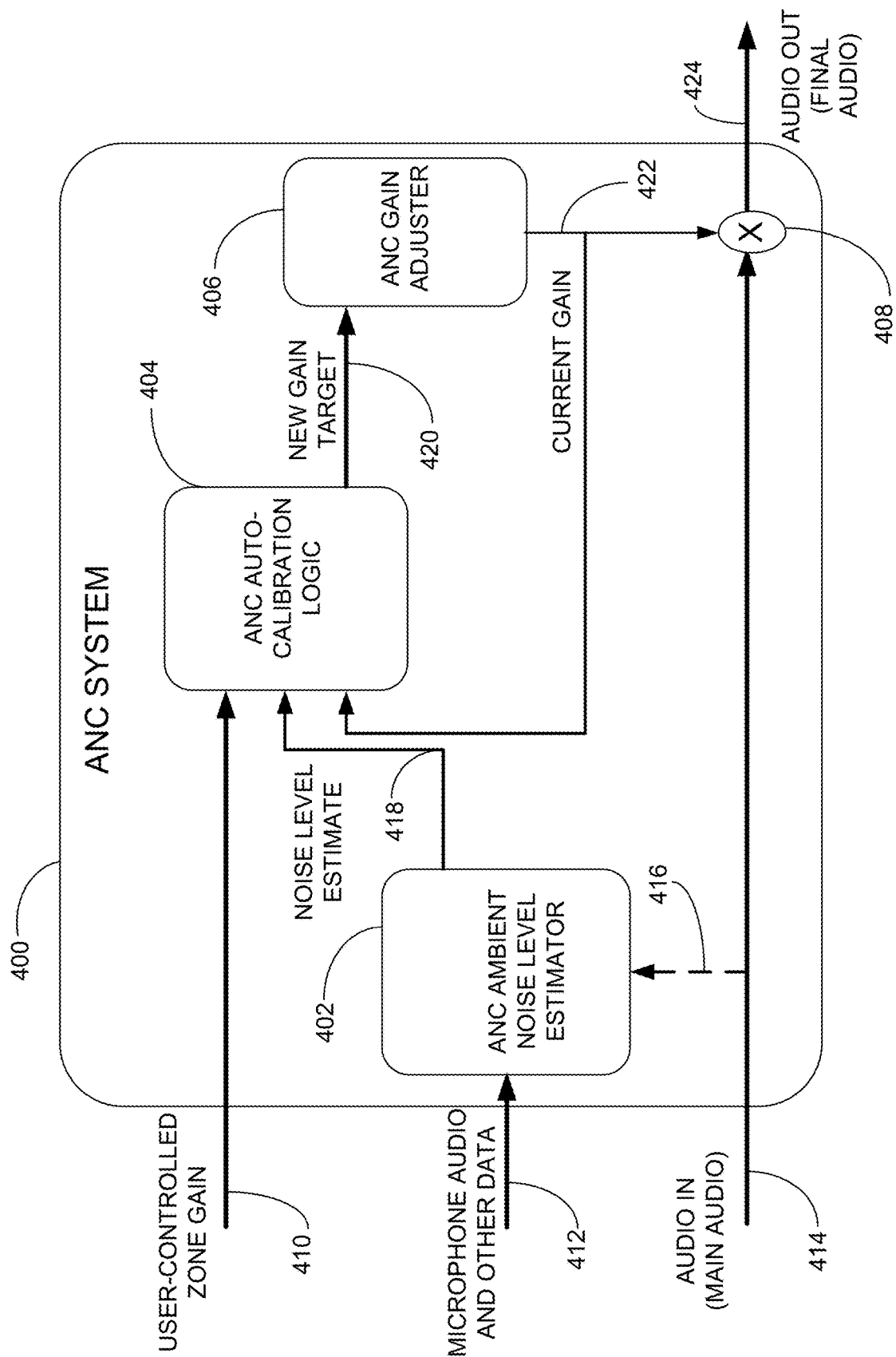
FIG. 4 is a diagrammatic view illustrating an exemplary embodiment of an ANC automatic calibration logic within an exemplary embodiment of the overall ANC system, according to a preferred embodiment of the present invention.

FIG. 4 is a diagrammatic view illustrating an exemplary embodiment of an ANC automatic calibration logic 404 within an exemplary embodiment of the overall ANC system 400, according to a preferred embodiment of the present invention. ANC system 400 includes an ANC ambient noise level estimator 402, an ANC automatic calibration logic 404, an ANC gain adjuster 406, and a digital gain circuit 408. The ANC system 400 takes as inputs a user-controlled zone gain 410, a microphone audio input 412 of the ambient noise plus any sound generated by loudspeakers in the zone, and the main audio 414 to be output to the loudspeakers in the zone. The ANC ambient noise level estimator 402 receives the microphone audio input 412 and possibly a sample 416 of the main audio 414 to determine an ambient noise level estimate 418 using any algorithm known in the art for such purposes, or any similarly functional algorithm yet to be developed.

In another preferred embodiment, FIG. 4 contains multiple copies of ANC ambient noise level estimator 402 (one per microphone audio input 412 in the given zone). An additional circuit would intake level estimates from each ANC ambient noise level estimator 402 and create a final level estimate as its output. ANC system 400 is replicated in its entirety for each acoustic zone.

The ANC automatic calibration logic 404 takes in user-controlled zone gain 410 (volume knob, equalizer input, etc.); the ambient noise level estimate 418 output from the ANC ambient noise level estimator 402; and the current ANC gain 422 from the output of the ANC gain adjuster 406. The ANC automatic calibration logic 404 produces a new ANC gain target 420 which is the input to the ANC gain adjuster 406. ANC gain adjuster 406 produces the current ANC gain 422 and supplies current ANC gain value 422 to digital gain circuit 408, which applies current ANC gain 422 to main audio 414 to produce final audio 424. The ANC automatic calibration logic 404 replaces the traditional computations used to determine current gain levels from current noise levels.

ANC automatic calibration logic 404 is comprised of the following components as shown and further discussed below in regard to FIG. 5: component one 504: updates composite gain curve; component two 506: computes current composite gain; and component three 508: computes ANC gain target. In various embodiments, the various components of the ANC automatic calibration logic 404 may or may not be executed in the same process (set of instructions), or on the same processor. ANC automatic calibration logic 404 includes memory (not shown) which may be centralized or distributed.

Figure 5:
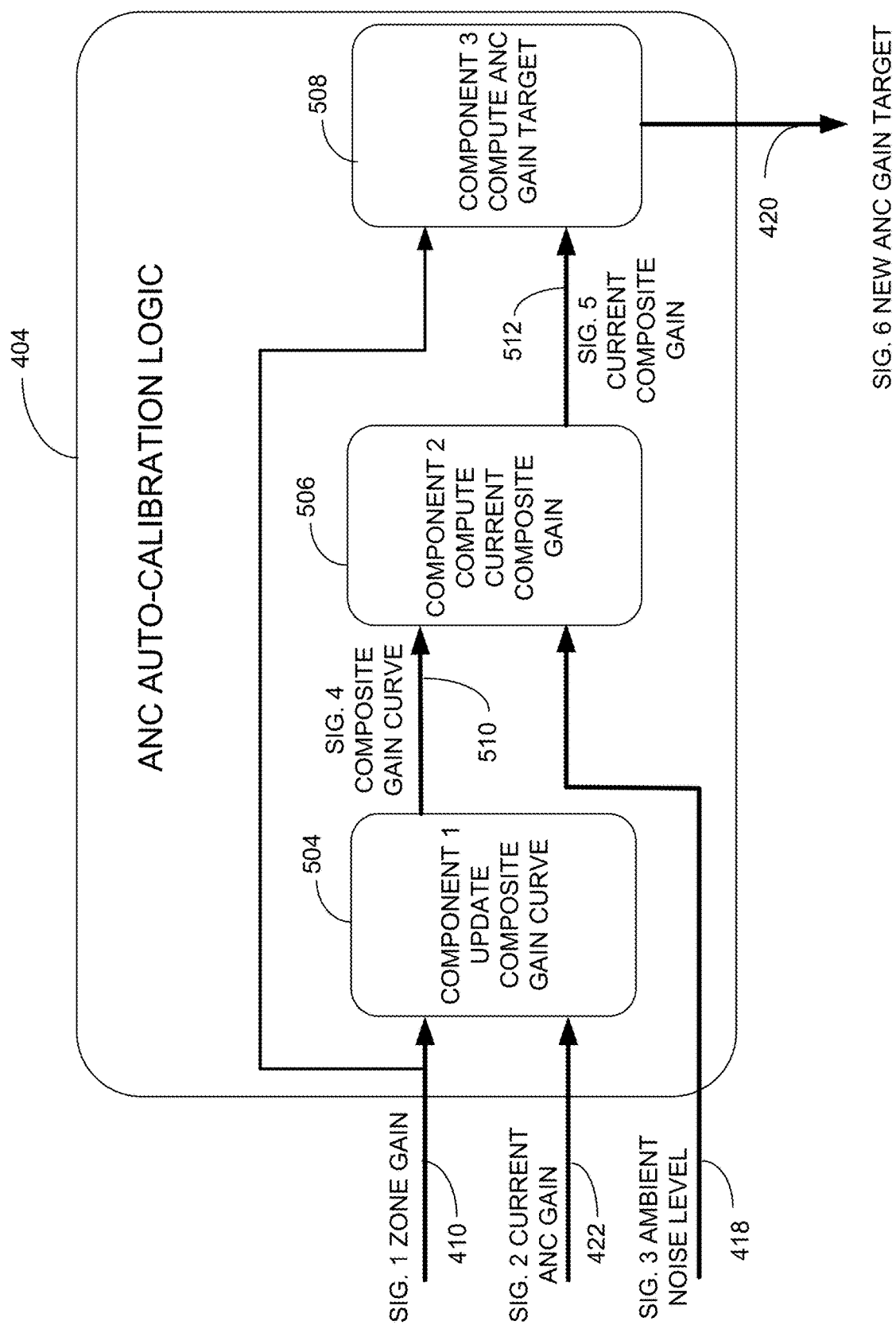
FIG. 5 is a diagrammatic view illustrating the exemplary embodiment of the ANC automatic calibration logic of FIG. 4, according to a preferred embodiment of the present invention.

FIG. 5 is a diagrammatic view illustrating the exemplary embodiment of the ANC automatic calibration logic 404 of FIG. 4, according to a preferred embodiment of the present invention. Component one 504 consists of computer instructions which receive the following inputs: signal one: user-controlled zone gain 410; and signal two, current ANC gain 422. Zone gain 410 is the user-controlled gain which controls the audio levels for a given channel. The given channel is then fed to speakers in a particular physical area or "zone." User-controlled zone gain 410 may be singular or a composite of multiple gains which represent as accurately as possible the gain-modifying controls to which the end-user has access. User-controlled zone gain 410 may include zone levels, compressor makeup gains, equalizer level adjustments, and any other settings which affect the overall steady-state gain of the audio path. User-controlled zone gain 410 represents the most recently set levels for the zone. Current ANC gain 422 is the gain currently applied by the associated ANC system 400.

The output of component one 504 is a composite gain curve 510, which is a mapping of ambient noise level estimates 418 to desired composite gain 114. Composite gain 114 is defined as a combination of the user-controlled zone gain 410 and the current ANC gain 422. The composite gain curve 510 preferably consists of a Composite Gain 114 vs Ambient Noise 112 Auto-Calibrating Look-Up Table 1300 of values or a gain curve fit equation 1304 (see FIG. 13) which approximates the relationship between the ambient noise level 112 estimates 418 and composite gain 114 levels. The composite gain curve 510 holds the calibration information specific to the end-user's preferences in their space, and may vary from space to space.

The logic governing component one 504 is a novel aspect of the invention. Component one 504 determines how the Composite Gain 114 vs Ambient Noise 112 Auto-Calibrating Look-Up Table 700 (see FIG. 7) (hereinafter "table 700") is modified when the user-controlled zone gains 410 are adjusted by the user. The behavior of the table 700 data points (hereinafter "nodes") which maps ambient noise level 112 to Composite Gain 114 is controlled in accordance with three algorithmic rules. The three algorithmic rules reside in a rules logic portion of the ANC automatic calibration logic in component one 504, preferably as lines of code. In the first rule, a left node must be less than or equal to the value of the node to its right. For the purposes of this patent, a "left" node represents a noise level lesser than a "right" node. In the second rule, a particular node can't be higher than X dB from its left neighbor. X is determined by a maximum slope parameter. In an exemplary embodiment with a 1:1 slope parameter, X is equal to the spacing of the dB noise levels such that if two nodes represent ambient noise levels 112 6 dB apart, then the right node cannot be more than 6 dB greater than its left neighbor. In some embodiments, the maximum slope parameter may be other than 1:1. In some embodiments, the maximum slope parameter may be a user input. In the third rule, nodes in inactive zones 808 and 810 (see FIG. 8) follow the value of their nearest active neighbor. An inactive zone 808 or 810 is any node 802 (see FIG. 8) which represents a noise level where the user has not yet adjusted a user-controlled zone gain input 410. There is a maximum of two inactive zones 808 and 810 (see FIG. 8). Any zone 806 in between inactive zones 808 and 810 will be considered as part of the active zone 806 (there is only up to a single active zone 806) (see FIG. 8). These inactive zones 808 and 810 serve a similar purpose to the upper and lower noise level thresholds calibrated by sound system integrators for traditional ANC systems. FIGS. 6-13 show how the new ANC gain target 420 gets determined by user-controlled zone gain 410 adjustments.

Component two 506 consists of computer instructions which receive inputs including signal four: updated composite gain curve 510 and signal three: ambient noise level estimate 418. Updated composite gain curve 510 is from component one 504 and signal three, ambient noise level estimate 418, which is an estimate of the current ambient noise level 418 in the zone as computed by the ANC ambient noise level estimator 402. The output of component two 506 is signal five: current composite gain 512. Current composite gain 512 represents the sum of the user-controlled zone gain 410 and current ANC gain 422 which should currently be applied in order to match the user's preference for the given ambient noise level estimate 418. The purpose of component two 506 is to compute the current composite gain 512 given the current ambient noise level estimate 418. The nature of the composite gain curve 510 (Composite Gain 114 vs Ambient Noise 112 Auto-Calibrating Look-Up Table 1300 vs equation of gain curve 1304, see FIG. 13) will determine how the current composite gain 512 will be computed.

Component three 508 computes the new ANC gain target 420 responsive to the current composite gain 512 and the user-controlled input zone gain 410. For non-limiting example, a simple arithmetic operation may be used where the current user-controlled zone gain 410 (in dB units) is subtracted from the current composite gain 512 (in dB units) to achieve the new ANC gain target 420 (in dB units). In various other embodiments, respective various other algorithms may be used.

Ideally the audio processing path should attempt to normalize the levels of the audio signal such that any end-user zone gain 410 adjustment to the levels in their space imply a desire to adjust the overall audio levels in that space, and not to adjust for temporary fluctuations in input signal strength.

The process can be easily extended for multi-channel use. A separate Composite Gain 114 vs Ambient Noise 112

Auto-Calibrating Look-Up Table 1300 (see FIG. 13) (hereinafter "table 1300") would be used for every channel of ANC algorithm processing. In a complex case with two zones and two microphones per zone, four separate tables 1300 would be used with a four-channel ANC algorithm. The ANC Gain Targets 420 pertaining to the same zone would have to be averaged together into a new signal representing the new gain target for the output audio in that zone.

In another embodiment, the ambient noise level estimates 418 could be computed for each microphone in a zone and then averaged together to make a final ambient noise level estimate per zone via an additional component within ANC system 400. In such an embodiment, a unique set of ANC automatic calibration logic 404 is needed per zone, but not per microphone within a zone.

Figure 6:
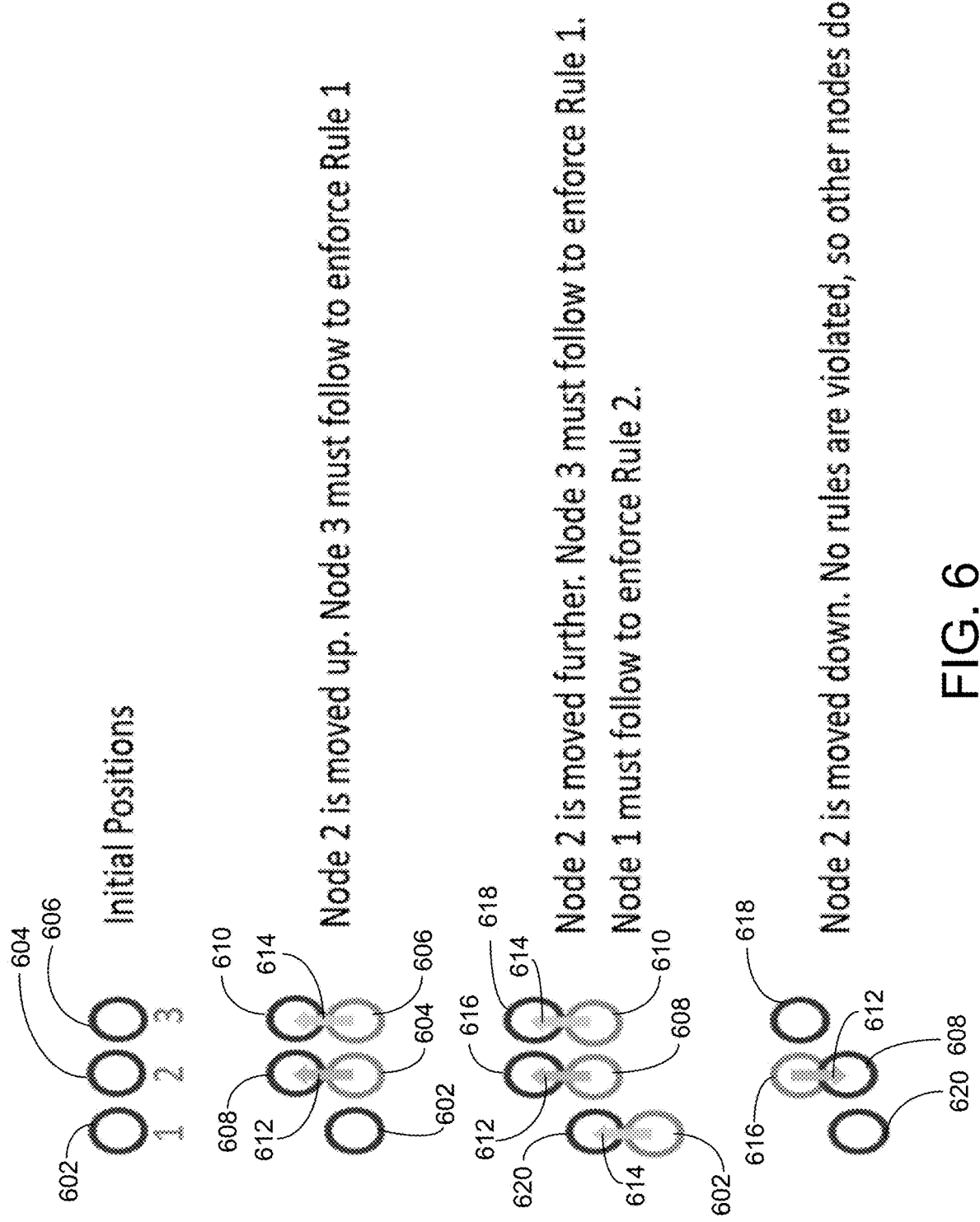
FIG. 6 is a diagrammatic view illustrating an exemplary embodiment of the operation of two algorithmic rules for moving nodes within a Composite Gain vs Ambient Noise table which can be calibrated, according to a preferred embodiment of the present invention.

FIG. 6 is a diagrammatic view illustrating an exemplary embodiment of the operation of two algorithmic rules for moving nodes 602, 604, and 606 within a table 700 (see FIGS. 7-13) which can be calibrated, according to a preferred embodiment of the present invention. Other logic may also be implemented which prevents major modifications to the shape of the composite gain curve 510 if the user sets a new zone gain level 410 which exceeds a predetermined limit on a change from its former value. Although referred to as a "curve" in FIG. 6, the composite gain curve 510 is actually the look-up-table in a preferred embodiment embodiment, which, if plotted makes a curve because of the logic rules creating it. Table 1300 and gain curve equation 1304 are two different data expressions of composite gain curve 510. For example, if a composite gain curve 510 or 1304 (see FIG. 13) has been calibrated and the end-user quickly turns the zone gain 410 down to –80 dB to make an announcement, safety measures are activated. Such measures vertically offset the calibrated composite gain curve 510 appropriately to meet the user's needs without modifying the curve's shape based on the extreme adjustment.

Figure 13:
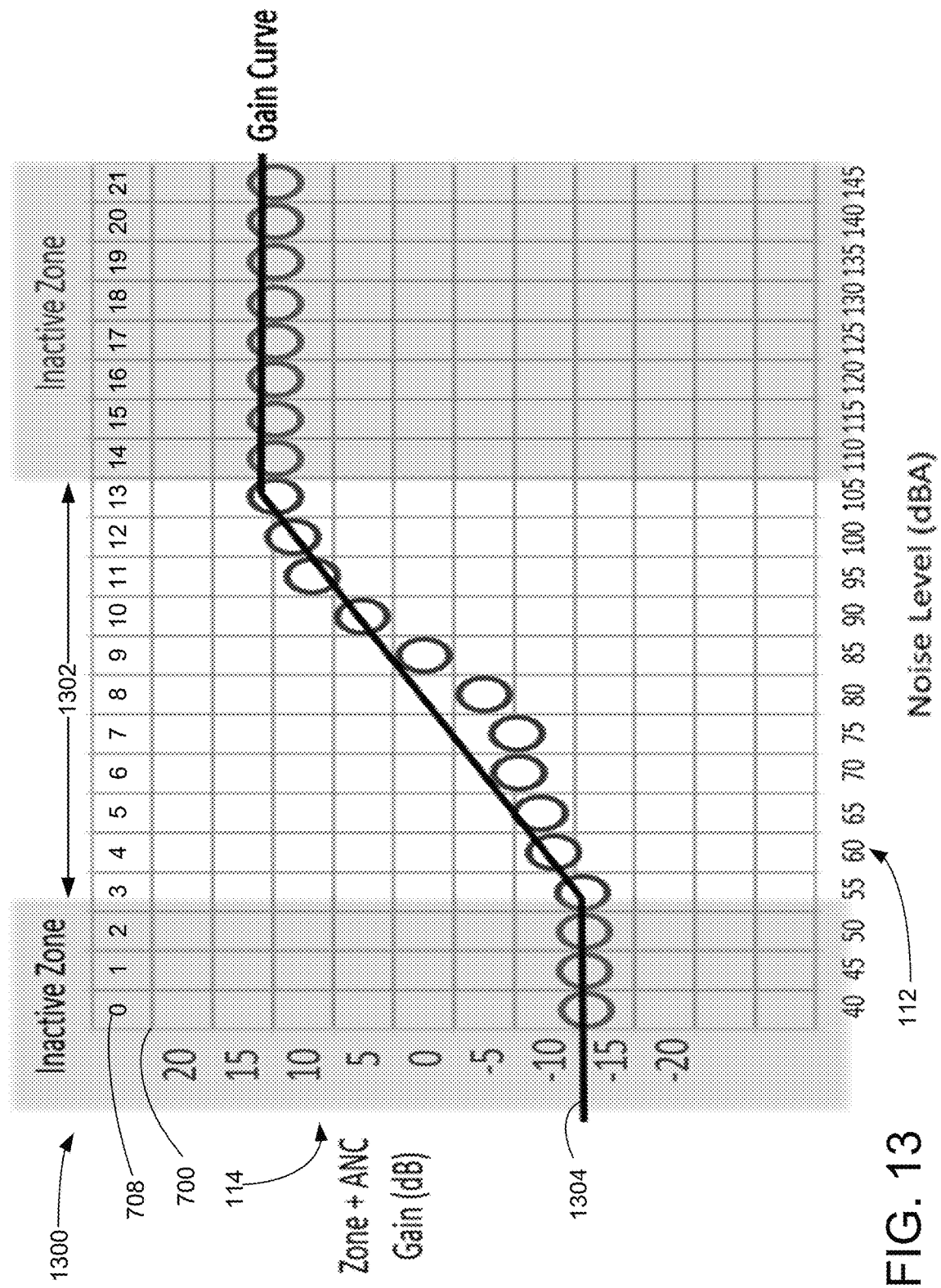
FIG. 13 is a Composite Gain vs Ambient Noise table view illustrating an exemplary gain curve fit to the data in the exemplary Composite Gain vs Ambient Noise table, of FIG. 7, of the exemplary embodiment of the automatic calibration algorithm of the exemplary embodiment of the Ambient Noise compensation system of FIG. 4, according to a preferred embodiment of the present invention.

It may be desired to fit some sort of continuous or piecewise composite gain curve 1304 to approximate the table 1300 values. The composite gain curve 1304 may be delivered as an output of component one 504 in place of or in addition to the table 1300 values. FIG. 13 shows one simple piecewise linear approximation composite gain curve 1304 to the table 1300 values. In a particular embodiment of ANC system 400, composite gain curve 1304 is used to derive ideal ANC settings for traditional ANC user interfaces.

In what follows, adjustments to user-controlled zone gain 410 are referenced as number 612 and algorithmic operations are referenced as number 614, regardless of direction or magnitude. The following discussions of FIGS. 6-13 reveals how the arrangement of nodes on the table 700 (see FIG. 7) is responsive to user-supplied zone gain inputs 410. The initial positions of adjacent nodes 602, 604, and 606, adjacent in a table 700 to be calibrated, illustrates the starting point for an illustration of the operation of two of the three algorithmic rules for moving nodes 602, 604, and 606 within the table 700 to be calibrated. First, node 604 increases in value and is moved up in a table column of a calibration table such as the table 700 to become node 608 by the user-controlled zone gain 410 increase 612. Rule one requires that a right node 606 which represents gain at a higher noise level must be greater than or equal to a node 608 to its left, so right node 606 moves up by algorithmic operation 614 to become node 610. Node 602 does not move yet. Second, node 608 is moved up to become node 616 by another user-controlled zone gain 410 increase 612. Again, the right node 610 must follow and moves up by algorithmic operation 614 to become node 618. Rule two provides that a node cannot be lower than a certain number of dB from its right-hand neighbor, and so node 602 moves up in accordance with rule two by algorithmic operation 614 to become node 620. Third, node 616 is moved down to become node 608 again by user-controlled zone gain 410 decrease 612. No rule is implicated, so no algorithmic adjustments are made to nodes 618 and 620.

Figure 7:
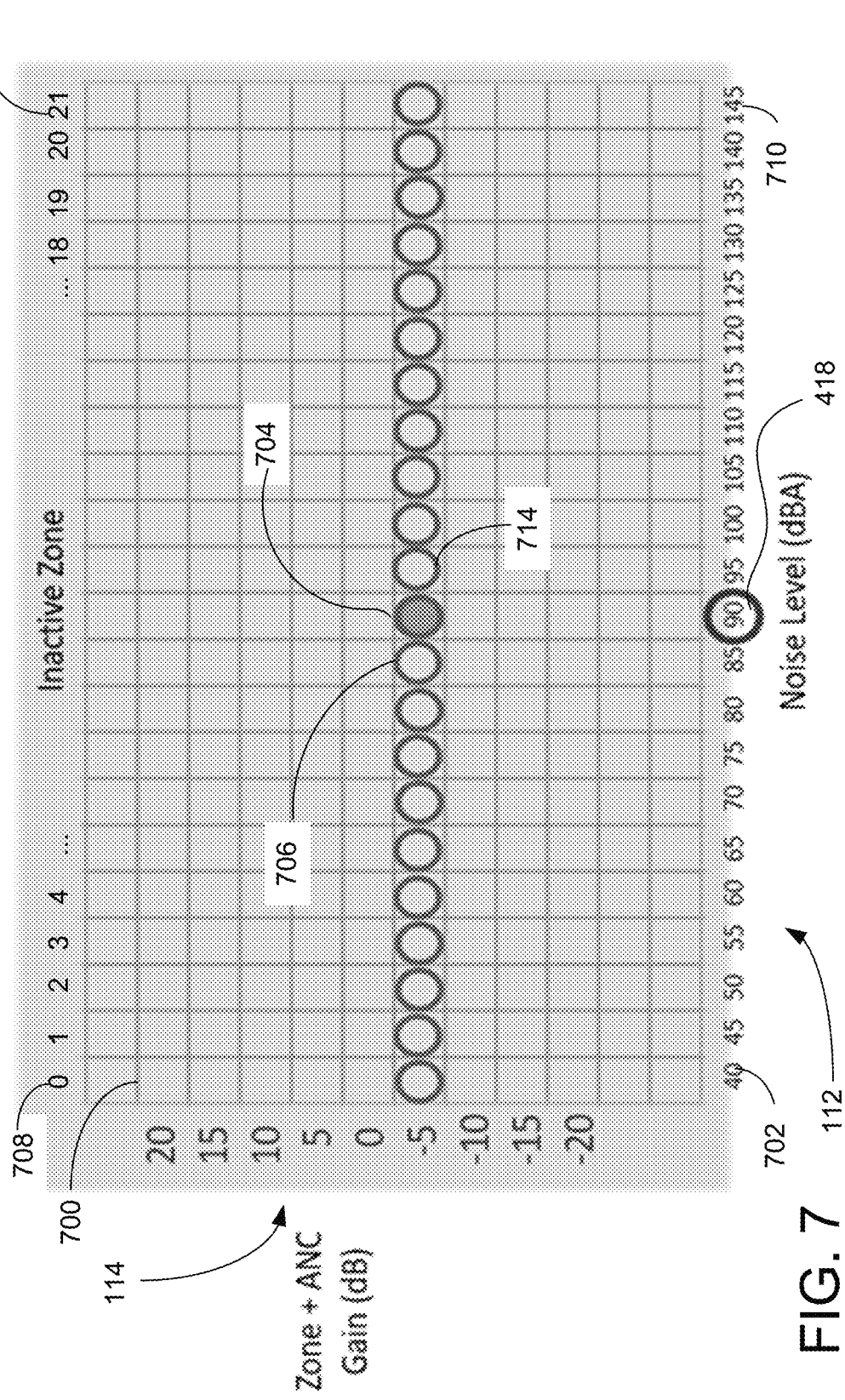
FIG. 7 is a Composite Gain vs Ambient Noise table view illustrating an exemplary embodiment of an initial state of the exemplary embodiment of automatic calibration logic of the exemplary embodiment of the Ambient Noise Compensation system of FIG. 4, according to a preferred embodiment of the present invention.

FIG. 7 is the table 700 view illustrating an exemplary embodiment of an initial state of the exemplary embodiment of the automatic calibration logic 404 of the ANC system 400 of FIG. 4, according to a preferred embodiment of the present invention. The illustrated table 700 includes vertical table columns corresponding to ambient noise levels 112 numbered 40-145 dBA by fives and unbounded horizontal table positions corresponding to composite gain 114 numbered –20 to 20 dB by fives. The units used are not a limitation of the present invention. For example, the horizontal axis may use sound pressure levels (dB SPL) instead of A-weighted dBA units. The illustrated horizontal and vertical scales are not a limitation of the present invention. Table 700 is shown at the beginning of the calibration process at installation, with all nodes (704, 706, 714, etc.) linearly arrayed horizontally and adjacent. In the discussion of table 700 that follows, integer numbers for ambient noise level estimate 418 and composite gain curve 510 are used as examples, but the invention is not so limited. In addition, table 700 does not have constrained rows: a node (704, 706, 714, etc.) may take any vertical position within the table 700 range. In various embodiments, respective various amounts of precision may be used, within the limit that the audio equipment using the new ANC gain target 420 can make use of such levels of precision. After the processes illustrated in FIGS. 7-13 are complete, it is novel that the user may not need to provide new zone gain 410 inputs ever again, absent highly unusual circumstances.

Initially, ANC system 400 applies unity gain at an exemplary current ambient noise level estimate 418, (for non-limiting illustrated example, ninety dBA) and a user-controlled zone gain 410 (user input) of negative five dBA. If the composite gain curve 510 consists of a table 700 of values, an equation maps the input ambient noise level estimate 418 level shown on the scale of ambient noise levels 112 to table indices 708 (i.e. mapping a forty to one hundred forty-five dBA range to table indices 708 (one of twenty-two labeled, i.e. zero to twenty-one). The mapping equation is: (estimated ambient noise level estimate 418 table value minus minimum table ambient noise value 702) divided by (maximum table noise value 710 minus minimum table ambient noise value 702) all multiplied by the maximum table index 712. For example, an ambient noise level estimate 418 of ninety-two dBA may map to a table index 708 (one of twenty-two labeled) of 10.2. The resulting composite gain 114 associated with the current ambient noise level 418 is computed from composite gain 114 values associated with the nearby indices: ten and eleven (see FIG. 8), mapping to nodes 704 and 714. Node 706 does not yet enter into gain calculation. Various embodiments use respectively various computational methods, but a simple solution is to linearly interpolate between values associated with the two nearest table indices 708 (ten and eleven). Simpler methods (i.e. rounding to nearest table index 708) or more complex methods (i.e. cubic spline interpolation) may be used in respective various embodiments.

Figure 8:
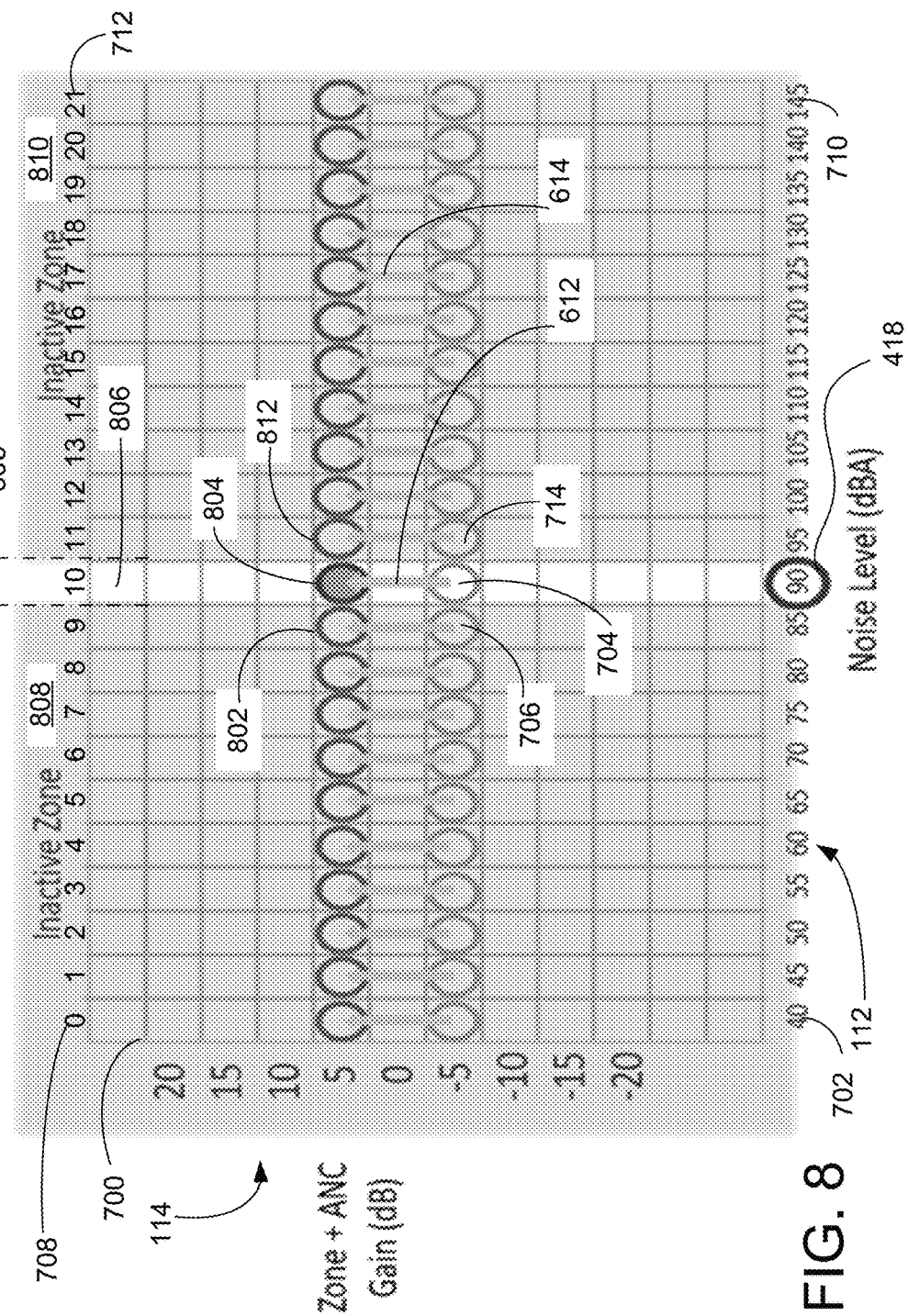
FIG. 8 is a Composite Gain vs Ambient Noise table view illustrating an exemplary embodiment of a second state of the exemplary embodiment of automatic calibration logic of the exemplary embodiment of Ambient Noise Compensation system of FIG. 4, according to a preferred embodiment of the present invention.

FIG. 8 is a table 700 view illustrating an exemplary embodiment of a second state of the exemplary embodiment of ANC automatic calibration logic 404 of the exemplary embodiment of ANC system 400 of FIG. 4, according to a preferred embodiment of the present invention. Calibration continues as user-controlled zone gain 410 increases (612) to five dB, moving node 704 up to become node 804. Nodes to the right and left of node 804 move up in accordance with rule three, keeping all nodes horizontally adjacent. Rule three provides that nodes in inactive zones 808 and 810 follow the value of their nearest active neighbor. A zone is made an active zone 806 by a user-controlled zone gain 410 input, which establishes an active zone 806 boundary. As a result of rule three, node 706, moves up by algorithmic operation 614 (one of twenty-one labeled) to become node 802 and node 714 moves up by algorithmic operation 614 (one of twenty-one labeled) to become node 812. Nodes to the left of node 706 also move up by algorithmic operation 614 (one of twenty-one labeled) in accordance with rule three. Nodes to the right of node 714 move up by algorithmic operation 614 (one of twenty-one labeled) in accordance with rule three. The user-controlled zone gain 410 increase 612 establishes active zone 806 in one table column with a table index 708 often as well as inactive zones 808 and 810.

Figure 9:
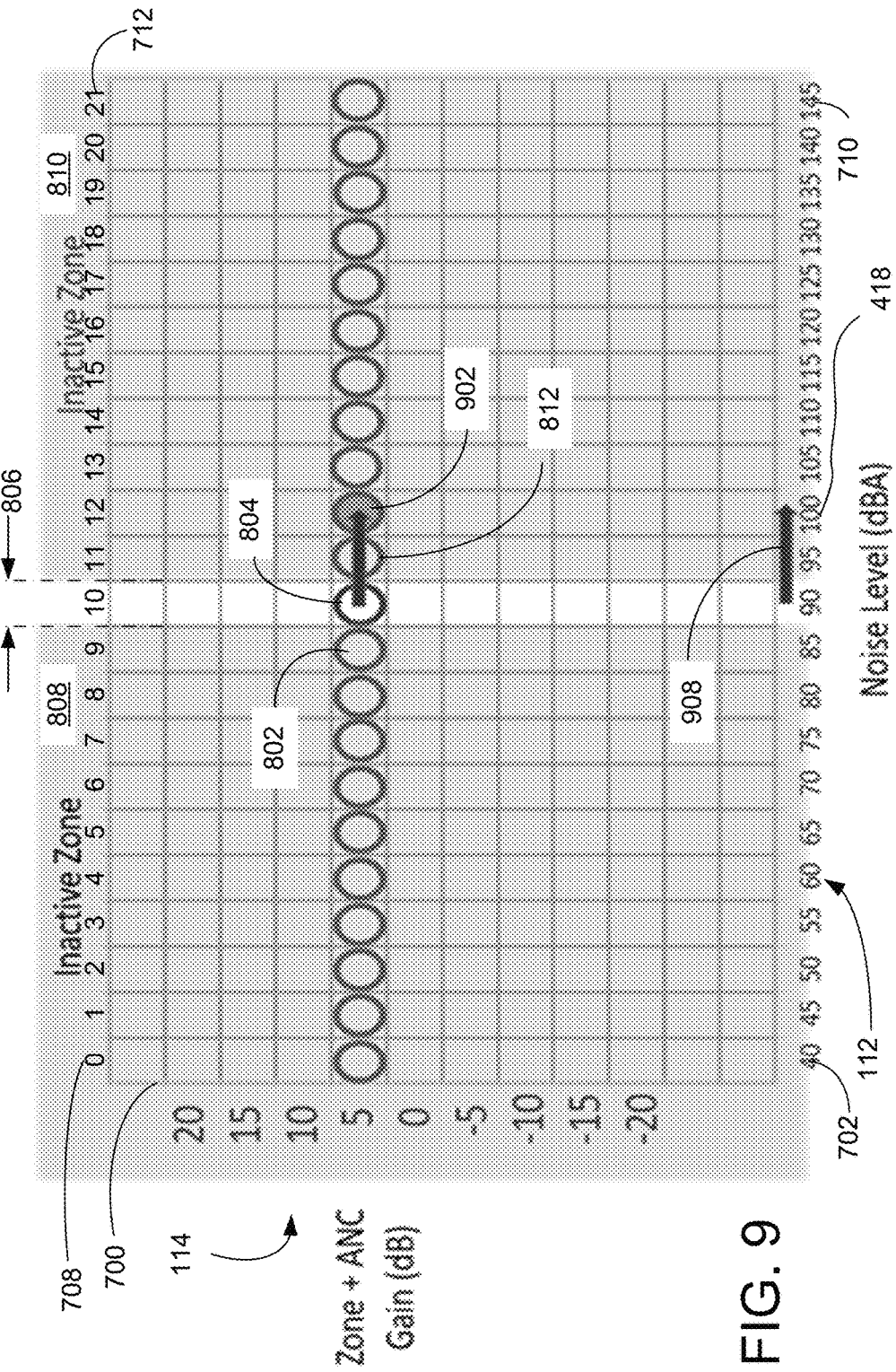
FIG. 9 is a Composite Gain vs Ambient Noise table view illustrating an exemplary response of the exemplary embodiment of the automatic calibration logic of the exemplary embodiment of the Ambient Noise Compensation system of FIG. 4 to an exemplary increase in the noise level estimate, according to a preferred embodiment of the present invention.

FIG. 9 is a table 700 view illustrating an exemplary response, of the exemplary embodiment of the ANC automatic calibration logic 404 of the exemplary embodiment of the ANC system 400, to an exemplary increase 908 in the ambient noise level estimate 418, according to a preferred embodiment of the present invention. The ambient noise level estimate 418 has increased 908 by ten dBA, making the current ambient noise level estimate 418 one hundred dBA and making node 902 the relevant node for gain calculation (5 dB). Node 902 remains in an inactive zone 810, as user-controlled zone gain 410 has not been changed yet. All nodes (802, 804, 812, 902, etc.) remain adjacent and horizontally arrayed.

Figure 10:
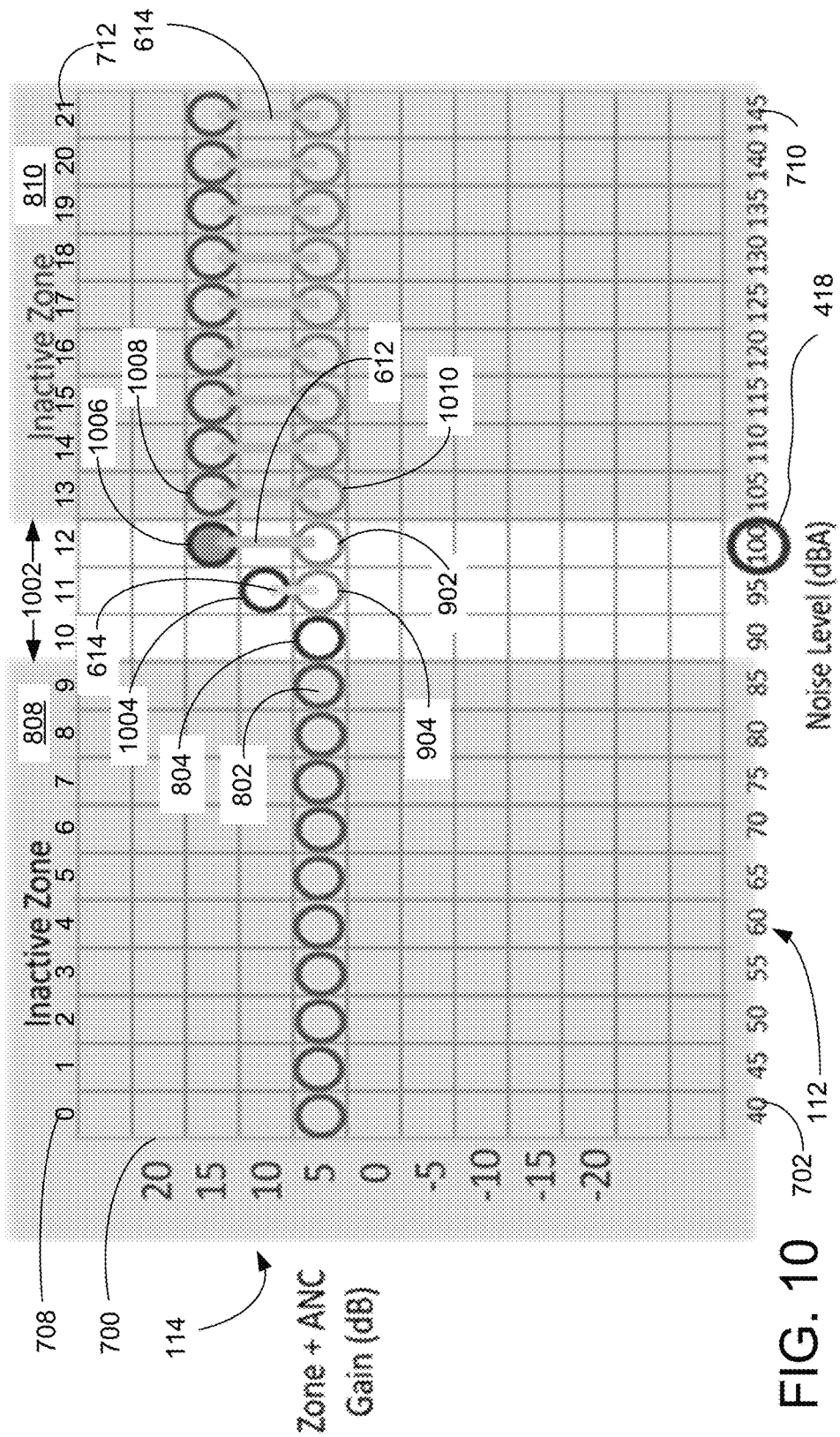
FIG. 10 is a Composite Gain vs Ambient Noise table view illustrating an exemplary response of the exemplary embodiment of the automatic calibration algorithm of the exemplary embodiment of the Ambient Noise compensation system of FIG. 4 to an exemplary user-implemented increase in the gain level, according to a preferred embodiment of the present invention.

FIG. 10 is a table 700 view illustrating an exemplary response of the exemplary embodiment of the ANC automatic calibration logic 404 of the exemplary embodiment of the exemplary embodiment of the ANC system 400 to an exemplary user-implemented increase 612 in the user-controlled zone gain 410, according to a preferred embodiment of the present invention. FIG. 10 shows a partially calibrated table 700. As a further calibration step, user-controlled zone gain 410 increases 612 such that the composite gain (gain 410 plus current ANC gain 422) is fifteen dB and so node 902 moves up to become node 1006 and creates a new boundary (table index 12) to the active zone 806, creating active zone 1002. Active zone 1002 encompasses table column indexes 10-12. Nodes 1010 (one of nine labeled) move up by algorithmic operation 614 (one often labeled) to become node 1008 and move up in accordance with rule three. Node 904 moves up by algorithmic operation 614 in accordance with rule two to become node 1004. Node 804 does not move and so nodes in the inactive zone 808 to the left of node 804 do not move. As the table 700 shows, an ambient noise level estimate 418 of ninety dBA would now map to a composite gain 114 of five dB, an ambient noise level estimate 418 of ninety-five dBA would now map to a composite gain 114 of ten dB, and an ambient noise level estimate 418 of one hundred dBA would now map to a composite gain 114 of fifteen dBA. FIG. 10 illustrates a partially calibrated table 700. Because the increased ambient noise level 112 that caused the user to increase the user-controlled zone gain 410 is more than one table column away from the previous active zone, more than one node changes position in response to a single user-controlled zone gain 410 input. Multiple nodes can change for any adjustment because of Rule 3. The active zone 1002 could change by more than one index at a time due to a single adjustment.

Figure 11:
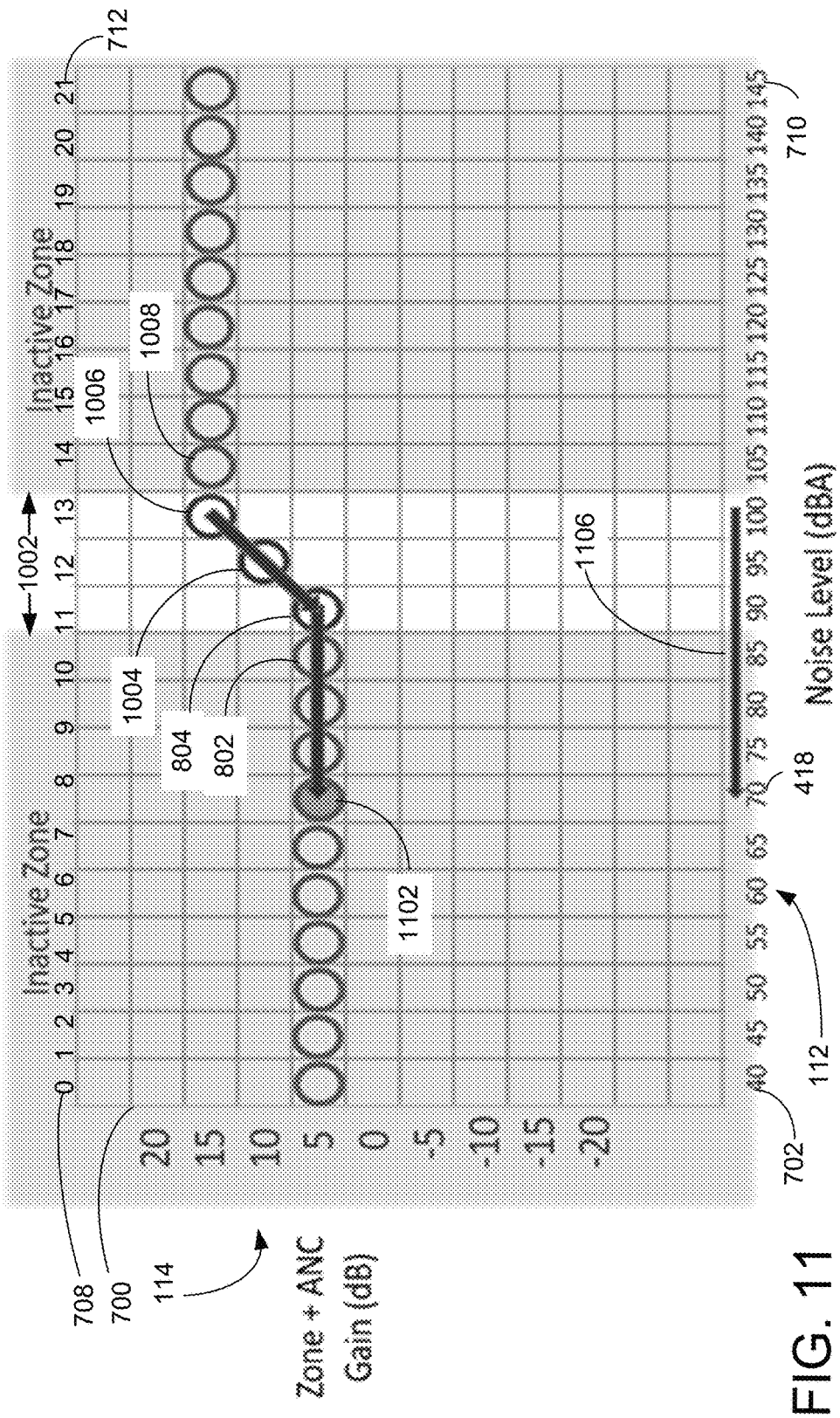
FIG. 11 is a Composite Gain vs Ambient Noise table view illustrating an exemplary response of the exemplary embodiment of the automatic calibration algorithm of the exemplary embodiment of the Ambient Noise compensation system of FIG. 4 to an exemplary decrease in the noise level, according to a preferred embodiment of the present invention.

FIG. 11 is a table 700 view illustrating an exemplary response of the exemplary embodiment of the ANC automatic calibration logic 404 to an exemplary decrease 1106 in the ambient noise level estimate 418, according to a preferred embodiment of the present invention. The decrease 1106 in the ambient noise level estimate 418 lowers the ambient noise level estimate 418 to seventy dBA, corresponding to a composite gain 114 of 5 dB, as shown by node 1102.

Figure 12:
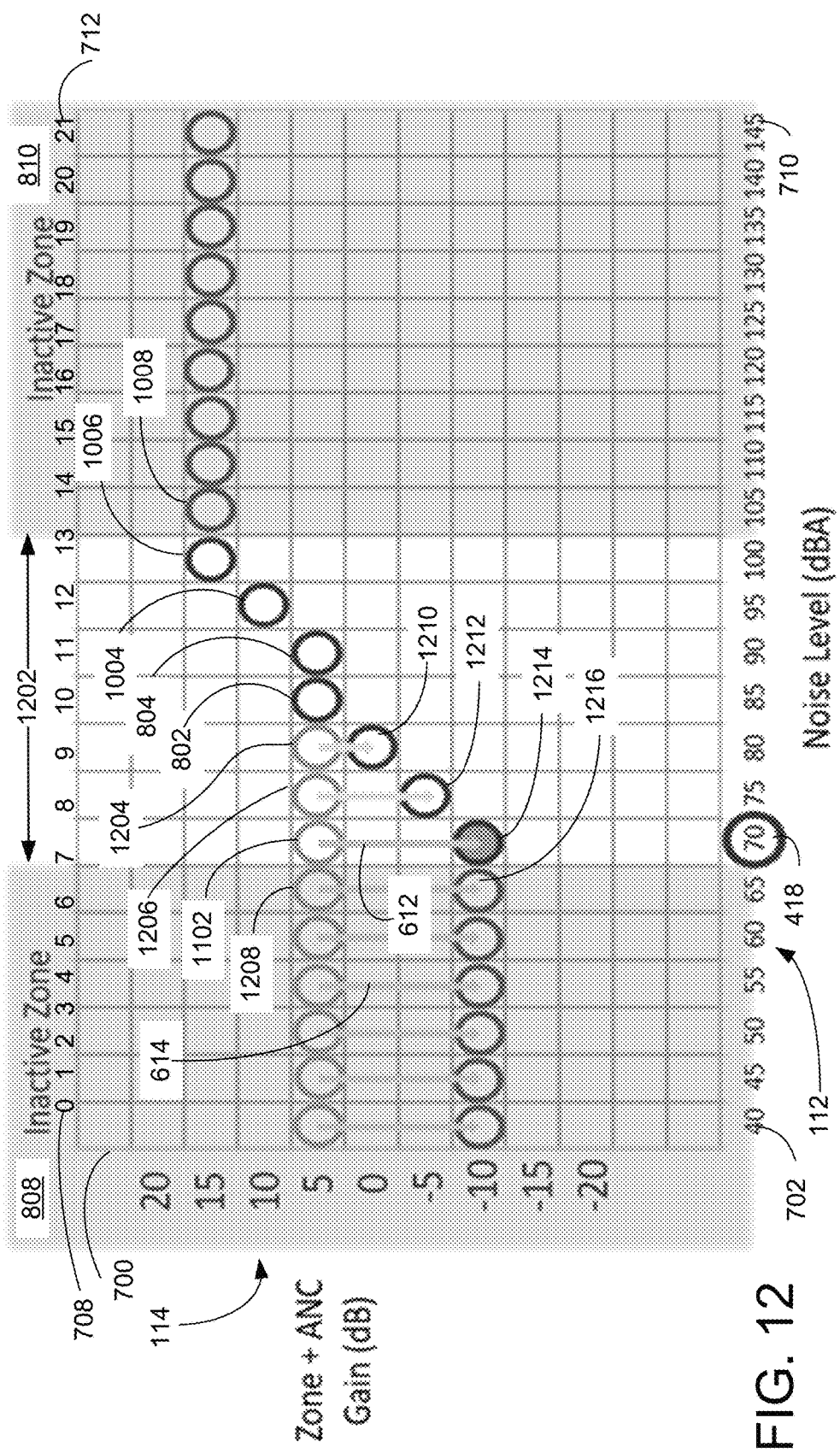
FIG. 12 is a Composite Gain vs Ambient Noise table view illustrating an exemplary response, of the exemplary embodiment of the automatic calibration algorithm of the exemplary embodiment of the Ambient Noise compensation system of FIG. 4, to an exemplary user-implemented decrease in the gain level, according to a preferred embodiment of the present invention.

FIG. 12 is a table 700 view illustrating an exemplary response, of the exemplary embodiment of the ANC automatic calibration logic 404 of the exemplary embodiment of the ANC system 400 of FIG. 4 to an exemplary user-implemented decrease 612 in the user-controlled zone gain 410 level, according to a preferred embodiment of the present invention. The user-implemented decrease 612 in the user-controlled zone gain 410 level moves node 1102 down to become node 1214, representing a composite gain 114 of negative ten dBA. Node 1206 moves down by algorithmic operation 614 (one of eight labeled) to become node 1212 in accordance with rule two. Node 1204 moves down by algorithmic operation 614 (one of eight labeled) to become node 1210 in accordance with rule two. Nodes 1208 (one of six labeled) moves down by algorithmic operation 614 (one of six labeled) to become nodes 1216 in inactive zone 808 in accordance with rule three. The user-implemented decrease 612 in the user-controlled zone gain level 410 sets a new boundary for the active zone 1202 (table index 7), now including table indexes of 7-13. Those of skill in the art should appreciate that the calibration process proceeds by user reactions to ambient noise changes, creating a calibrated table 700 which can continue to implement the user's preferences without any conscious effort from the user to calibrate the algorithm. Because the decreased ambient noise level 112 that caused the user to decrease the user-controlled zone gain 410 is more than one table column away from the previous active zone, more than one node changes position in response to a single user-controlled zone gain 410 input. Multiple nodes can change for any adjustment because of Rule 3. The active zone 1202 could change by more than one index at a time due to a single adjustment.

FIG. 13 is a table 1300 view illustrating an exemplary composite gain curve 1304 fit to the data in an exemplary extension of table 700, of FIG. 7 of the exemplary embodiment of the ANC automatic calibration logic 404 of the exemplary embodiment of the ANC system 400 of FIG. 4, according to a preferred embodiment of the present invention. Active zone 1302 now includes table column indexes 3-13, indicating further user-controlled zone gain 410 inputs have been made. A novel aspect of the present invention is that it preserves user responses in the form of a composite gain curve 1304 or table 1300 of values, thereby calibrating the ANC system 400. After the user has entered zone gain 410 inputs for enough of the ambient noise levels 112 encountered in the acoustic space, further user-controlled zone gain 410 changes may never be necessary. A continuous or piecewise gain curve 1304 to approximate the calibrated table 1300 composite gain 114 values as a function of ambient noise level 112 values is shown in FIG. 13. Composite gain curve 1304 may be delivered as an output composite gain curve 510 of component one 504 in place of or in addition to the table 1300 values. FIG. 13 shows one simple piecewise linear approximation of composite gain curve 1304 to the table 1300 values. Composite gain curve 1304 is useful to derive ideal ANC settings for traditional ANC user interfaces.

The nodes (804, 1004, and 1006) corresponding to 90 dBA, 95 dBA, and 100 dBA, respectively, in FIG. 13 illustrate a constraint by the maximum slope parameter of 1:1.

The claims that follow include some functional claiming. There are no statements of intended use in the following claims.

We claim:

1. An apparatus for automatically calibrating a gain curve on a Composite Gain vs Ambient Noise calibrating look-up table in an ambient noise compensation (ANC) system, the apparatus comprising:
    a. an ANC automatic calibration logic and memory;
    b. said Composite Gain vs Ambient Noise calibrating look-up table maintained in said ANC automatic calibration logic and memory;
    c. a plurality of data points (nodes) in said Composite Gain vs Ambient Noise calibrating look-up table;
    d. said ANC automatic calibration logic, comprising:
        i. a zone gain signal input coupling for receiving a zone gain input signal;
        ii. an ambient noise signal input coupling for receiving an ambient noise signal; and
        iii. a current ANC gain signal input coupling for receiving a current ANC gain signal;
    e. wherein:
        i. a particular said node of said plurality of nodes maps a respective particular ambient noise signal level to a respective particular composite gain; and
        ii. each particular said zone gain signal input, receivable at said zone gain signal input coupling, at a particular said ambient noise level input receivable in said ambient noise signal input coupling is operable to map at least one corresponding said particular node to a new said particular composite gain.

2. The apparatus of claim 1, wherein said zone gain signal input is user-controlled.

3. The apparatus of claim 1, comprising rule logic within said ANC automatic calibration logic operable to implement algorithmic rules, wherein said rule logic is operable to change an arrangement of said plurality of nodes to form a calibrated composite gain curve, responsive to said zone gain signal input and their coincident ambient noise levels.

4. The apparatus of claim 3, wherein:
    a. said Composite Gain vs Ambient Noise look-up table is operable to have up to one active zone with left and right table column boundaries and no more than two inactive zones, wherein said left and right table column boundaries of said active zone are determined by said zone gain signal inputs; and
    b. each particular said zone gain input corresponding to a particular said ambient noise level input that is more than one table column away from a previous active zone boundary is operable to map at least one said node to change said particular composite gain for each said at least one said node of said one or more nodes, responsive to said algorithmic rules.

5. The apparatus of claim 4, comprising said algorithmic rules in said rule logic, said rules comprising:
    a. a left node must be less than or equal to an adjacent right node, where a right node corresponds to a higher ambient noise level than said left node;
    b. a particular said right node cannot be higher than X dB from an adjacent said left node, wherein X is determined based on a maximum slope parameter;
    c. said nodes in any said inactive zone are one of:
        i. in horizontal array with their adjacent nearest said node in said active zone; and
        ii. in horizontal array without said active zone; and
    d. if a user-controlled zone gain input change exceeds a predetermined limit, then a shape of said gain curve is not modified.

6. The apparatus of claim 5, wherein said maximum slope parameter is one of:
    a. user-controlled; and
    b. predetermined.

7. The apparatus of claim 5, comprising curve-fitting logic in said ANC automatic calibration logic operable to produce a composite gain curve representative of said arrangement of adjacent said nodes.

8. The apparatus of claim 7, comprising current composite gain determination logic within said ANC automatic calibration logic operable to produce a current composite gain responsive to inputs of said composite gain curve and said ambient noise signal.

9. The apparatus of claim 8, comprising gain target determination logic operable to produce a current ANC gain target responsive to inputs of said current composite gain and said ambient noise signal.

10. The apparatus of claim 9, comprising said apparatus for automatically calibrating a gain curve on a Composite Gain vs Ambient Noise look-up table installed in an ANC system.

11. An apparatus for automatically calibrating a gain curve on a Composite Gain vs Ambient Noise look-up table in an ambient noise compensation (ANC) system, the apparatus comprising:
    a. an ANC automatic calibration logic and memory;
    b. said Composite Gain vs Ambient Noise look-up table maintained in said ANC automatic calibration logic and memory;
    c. a plurality of data points (nodes) in said composite gain vs ambient noise look-up table;
    d. said ANC automatic calibration logic further comprising:
        i. a zone gain signal input coupling for receiving a zone gain input signal;
        ii. an ambient noise signal input coupling for receiving an ambient noise signal; and
        iii. a current ANC gain signal input coupling for receiving a current ANC gain signal;
    e. wherein:
        i. a particular said node of said plurality of nodes maps a respectively particular said ambient noise signal level to a respectively particular said composite gain; and
        ii. each particular said zone gain input, receivable at a corresponding particular said zone gain signal input coupling, at a particular said ambient noise level input, receivable in said ambient noise signal input coupling, is operable to map at least one corresponding said particular node to change said particular composite gain; and
    f. rule logic within said ANC automatic calibration logic operable to implement algorithmic rules, wherein said rule logic is operable to change or maintain an arrangement of nodes to form a calibrated said composite gain curve, responsive to said zone gain signal input.

12. The apparatus of claim 11, comprising:
a. up to one active zone with left and right table column boundaries and no more than two inactive zones in said Composite Gain vs Ambient Noise look-up table, wherein said left and right table column boundaries of said active zone are determined by said zone gain signal inputs and wherein each particular said zone gain input corresponding to a particular said ambient noise level input that is more than one table column away from a previous active zone boundary is operable to map one or more said nodes to change said particular composite gain for each said node of said one or more nodes; and
b. algorithmic rules in said rule logic comprising:
  i. a said left node must be less than or equal to an adjacent right said node, wherein a right said node corresponds to a higher ambient noise level than a left said node;
  ii. a particular said right node cannot be higher than X dB from an adjacent said left node, wherein X is determined based on a predetermined maximum slope parameter; and
  iii. said nodes in any said inactive zone are one of:
    1. in horizontal array with their adjacent nearest said node in said active zone; and
    2. in horizontal array without said active zone; and
    3. if a user-controlled zone gain input change exceeds a predetermined limit, then a shape of said gain curve is not modified.

13. The apparatus of claim 12, comprising curve-fitting logic in said ANC automatic calibration logic operable to produce said composite gain curve representative of said arrangement of adjacent said nodes.

14. The apparatus of claim 12.b.iii, comprising current composite gain determination logic within said ANC automatic calibration logic operable to produce a current composite gain responsive to inputs of said composite gain curve and said ambient noise signal.

15. The apparatus of claim 14, comprising gain target determination logic operable to produce a current ANC gain target responsive to inputs of said current composite gain and said ambient noise signal.

16. The apparatus of claim 15, comprising said apparatus for automatically calibrating a gain curve on a Composite Gain vs Ambient Noise look-up table in an ANC system.

17. An apparatus for automatically calibrating a gain curve on a Composite Gain vs Ambient Noise look-up table in an ANC system, the apparatus comprising:
a. an ANC automatic calibration logic and memory;
b. said Composite Gain vs Ambient Noise look-up table maintained in said ANC automatic calibration logic and memory;
c. a plurality of data points (nodes) in said Composite Gain vs Ambient Noise look-up table;
d. said ANC automatic calibration logic further comprising:
  i. a zone gain signal input coupling for receiving a zone gain input signal;
  ii. an ambient noise signal input coupling for receiving an ambient noise signal; and;
  iii. a current ANC gain signal input coupling for receiving a current ANC gain signal;
e. wherein:
  i. each particular node of said plurality of nodes maps a respectively particular ambient noise level to a respectively particular composite gain; and
  ii. each particular said zone gain input, receivable at a corresponding particular said zone gain signal input coupling, at a particular said ambient noise level input receivable in said ambient noise signal input coupling, is operable to map at least one corresponding said particular node to change said particular composite gain;
f. rule logic within said ANC automatic calibration logic operable to implement three algorithmic rules, wherein said rule logic is operable to change an arrangement of said nodes to form a calibrated composite gain curve, responsive to said zone gain signal input;
g. said Composite Gain vs Ambient Noise look-up table having up to one active zone with left and right table column boundaries and no more than two inactive zones in said composite gain vs ambient noise look-up table, wherein said left and right table column boundaries of said active zone are determined by said zone gain signal inputs and their coincident ambient noise levels;
h. algorithmic rules in said rule logic comprising:
  i. a said left node must be less than or equal to an adjacent right said node, wherein a right node corresponds to a higher ambient noise level than a left node;
  ii. a particular said right node can't be higher than X dB from an adjacent said left node, wherein X is determined based on a maximum slope parameter;
  iii. said nodes in any said inactive zones are in horizontal array with their adjacent said node in any said active zone; and
  iv. if a user-controlled zone gain input change exceeds a predetermined limit, then occurs one of:
    1. said Composite Gain vs Ambient Noise look-up table is not modified; and
    2. a shape of said gain curve is not modified.

18. The apparatus of claim 17, comprising:
a. up to one said active zone with left and right table column boundaries and no more than two said inactive zones in said Composite Gain vs Ambient Noise look-up table, wherein said left and right table column boundaries of said active zone are determined by said zone gain signal inputs and wherein each particular said zone gain signal input corresponding to a particular said ambient noise level input that is more than one table column away from a previous active zone boundary is operable to map one or more nodes to change said particular composite gain for at least one said node of said one or more nodes;
b. curve-fitting logic in said ANC automatic calibration logic operable to produce said composite gain curve equation representative of said arrangement of adjacent said nodes; and
c. current composite gain determination logic within said ANC automatic calibration logic operable to produce a current composite gain responsive to inputs of said composite gain curve and said ambient noise signal.

19. The apparatus of claim 18, comprising gain target determination logic operable to produce a current ANC gain target responsive to inputs of said current composite gain and said ambient noise signal.

20. The apparatus of claim 19, comprising said apparatus for automatically calibrating said gain curve on a Composite Gain vs Ambient Noise look-up table installed in an ANC system.

* * * * *